United States Patent [19]
Abe

[11] Patent Number: 6,143,149
[45] Date of Patent: Nov. 7, 2000

[54] MAGNETRON WITH PLURALITY OF TARGETS IN CORRESPONDENCE TO SHIELD MEMBERS

[75] Inventor: Ken-ichiro Abe, Tokyo, Japan

[73] Assignee: NEC Corporation, Tokyo, Japan

[21] Appl. No.: 09/312,891

[22] Filed: May 17, 1999

[30] Foreign Application Priority Data

May 15, 1998 [JP] Japan ................... 10-134096

[51] Int. Cl.[7] ................... C23C 14/00
[52] U.S. Cl. ............... 204/298.26; 204/298.11; 204/298.08; 204/298.12; 204/298.18; 204/192.12
[58] Field of Search .......... 204/298.12, 298.18, 204/298.26, 298.08, 298.11, 192.15, 192.12

[56] References Cited

U.S. PATENT DOCUMENTS

| | | | |
|---|---|---|---|
| 3,829,373 | 8/1974 | Kuehnle | 204/298.12 |
| 4,468,313 | 8/1984 | Okumura et al. | 204/298.12 |
| 4,485,000 | 11/1984 | Kawaguchi et al. | 204/298.12 |
| 4,505,798 | 3/1985 | Ramachandran et al. | 204/298.09 |
| 4,842,706 | 6/1989 | Fukasawa et al. | 204/298.13 |

FOREIGN PATENT DOCUMENTS

| | | | |
|---|---|---|---|
| 0 634 499 | 1/1995 | European Pat. Off. | |
| 176514 | 1/1972 | Germany | 204/298.12 |
| 61-041766 | 2/1986 | Japan . | |
| 62-161956 | 7/1987 | Japan . | |
| 1-116069 | 5/1989 | Japan . | |
| 3-075368 | 3/1991 | Japan . | |
| 5-263234 | 10/1993 | Japan . | |
| 7-097686 | 4/1995 | Japan . | |
| WO 94/19508 | 9/1994 | WIPO | 204/192.15 |

*Primary Examiner*—Nam Nguyen
*Assistant Examiner*—Daborah Chacko-Davis
*Attorney, Agent, or Firm*—Young & Thompson

[57] ABSTRACT

A sputtering apparatus is provided with a wafer holder disposed in a chamber. A wafer is placed on the wafer holder. A target is disposed in the chamber such as to be opposed to the wafer on the wafer holder. The target is divided into a plurality of pieces. In the sputtering apparatus, there are provided a gas controlling device which exhausts air from the chamber and introduces sputtering gas into the chamber, and a power source device which applies voltage to the target. The power source device individually controls the voltage to be applied to each of the divided targets. A shield member is provided in the chamber. The shield member partitions the chamber in correspondence to the divided targets.

3 Claims, 4 Drawing Sheets

MAGNETRON WITH PLURALITY OF TARGETS IN CORRESPONDENCE TO SHIELD MEMBERS

BACKGROUND OF THE INVENTION

1. Field of the Invention

The present invention relates to a sputtering apparatus used for producing semiconductor devices, and more particularly, to a sputtering apparatus capable of forming a film on a single wafer under two or more kinds of conditions.

2. Description of the Related Art

In the manufacture of semiconductor devices, the trend toward increasing diameter of a silicon wafer is growing so as to enlarge a region for fabricating a chip. By increasing the diameter of a silicon wafer, it is possible to remarkably reduce a per-unit price of a chip. However, a per-unit price of a silicon wafer having large diameter is still high, and there is a drawback that the cost is excessively high to research and develop using a large diameter wafer.

For example, in a manufacturing process of semiconductor devices, a sputtering apparatus is used for forming various films on a substrate. FIG. 1 is a sectional view showing a conventional sputtering apparatus. This sputtering apparatus includes a cylindrical chamber 49, which is provided at its bottom with an Ar gas introducing port 47 and an exhaust port 48 for introducing gas and exhausting air, respectively. A wafer holder 50 for holding a silicon wafer 45 is disposed on a bottom wall within the chamber 49. A target electrode 41 is supported by the chamber 49 at its upper portion through an insulator 52. A high-voltage power source 43 is connected to the target electrode 41. A magnet 51 is built in the disk-like target electrode 41 so as to adjust plasma by magnetic field by the magnet 51. The target electrode 41 is formed hollow for allowing coolant 46 to flow through the target electrode 41 to cool the latter. A cylindrical shield plate 44 is supported by the upper portion of the chamber 49 such as to surround the target electrode 41, a target material 42 and the silicon wafer 45.

In the conventional sputtering apparatus constituted as described above, the Ar gas is introduced into the chamber 49 from the gas introducing port 47 while exhausting air from the sputtering chamber 49 through the exhaust port 48, thereby bringing an atmosphere in the chamber 49 into an Ar gas atmosphere of predetermined pressure. Then, if negative voltage is applied to the target electrode 41 from the high-voltage power source 43, the target material 42 is negatively charged so that $Ar^+$ ion collides against the target material 42. Sputter atoms are released from the target material 42 due to energy caused by the collision of the $Ar^+$ ion. When the sputter atoms reach the wafer 45 or the shield plate 44 located at the counter electrode, the sputter atoms lose energy, and a film is formed on the wafer 41 and the shield plate 44.

In the process of research and development, various films are formed on a silicon wafer by changing conditions such as sputtering power and sputtering time, and the wafer is evaluated. In this case, if the conventional sputtering apparatus is used, it is necessary to use one wafer for each of the various film formation conditions. Therefore, if the research and the development are to be carried out by the sputtering apparatus using the conventional large-diameter wafer, there is a drawback that it is expensive.

Meanwhile, as a technique for preventing a surface of the target from being broken during the sputtering, there is proposed a target structure in which film formation material is divided into a plurality of pieces, and these pieces are arranged on a flat plate as a single film formation material (Japanese Patent Application Laid-open No. 5-263234). However, this prior art can not remove the waste caused when the large-diameter wafer is used in the process of experiment and research either.

SUMMARY OF THE INVENTION

It is an object of the present invention to provide a sputtering apparatus capable of forming a film on one wafer in one chamber under a plurality of sputtering conditions.

A sputtering apparatus according to one aspect of the present invention may include a chamber, a wafer holder disposed in the chamber, on the wafer holder a wafer is placed, a target disposed in the chamber such as to be opposed to the wafer on the wafer holder, the target being divided into a plurality of pieces, a gas controlling device which exhausts air from the chamber and introduces sputtering gas into the chamber, a power source device which applies voltage to the target, the power source device individually controlling the voltage to be applied to each of the divided targets, and a shield member provided in the chamber, the shield member partitions the chamber in corresponding to the divided targets.

The divided target may include a target member which contains a film formation material and is divided into a plurality of pieces and a target electrode which holds the target material and applies the voltage to the target material, divided in corresponding to the divided target members, each of the divided target electrodes having substantially the same size as that of the divided target members, and the power source device may individually control and apply voltage to each of the divided target electrodes.

The shield member may have a plurality of plates disposed radially relative to a position aligned to the center of the wafer.

The sputtering apparatus may further comprise a magnet built in the target electrode.

The sputtering apparatus may further comprise an insulating member provided between the divided targets.

According to one aspect of the present invention, it is possible to form a film on one wafer under two or more sputtering conditions, and to effectively use a large-diameter wafer in the process of research and development.

DESCRIPTION OF THE PREFERRED EMBODIMENT

Figure 1:
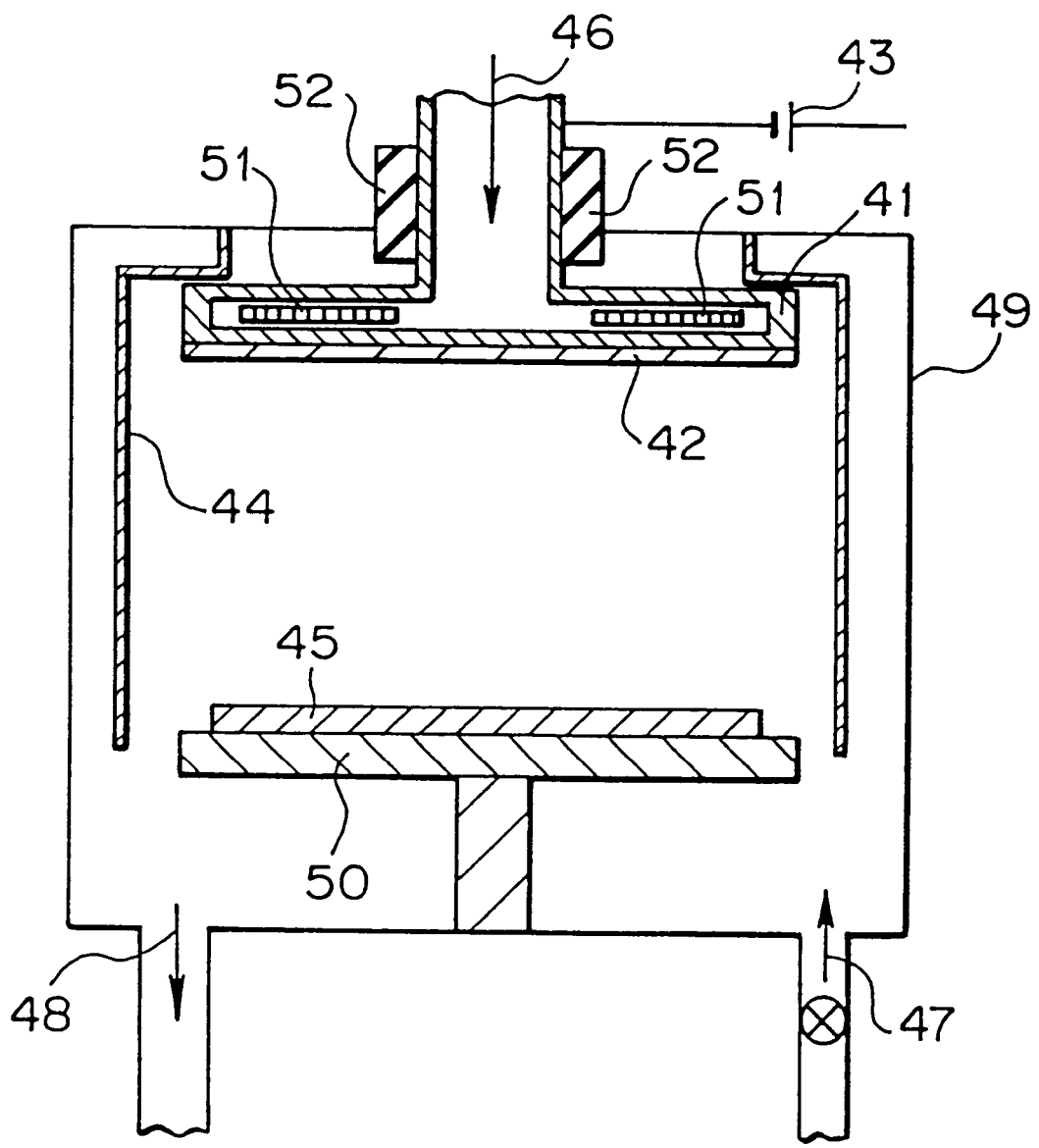
FIG. 1 is a sectional view showing a conventional sputtering apparatus.
Figure 2:
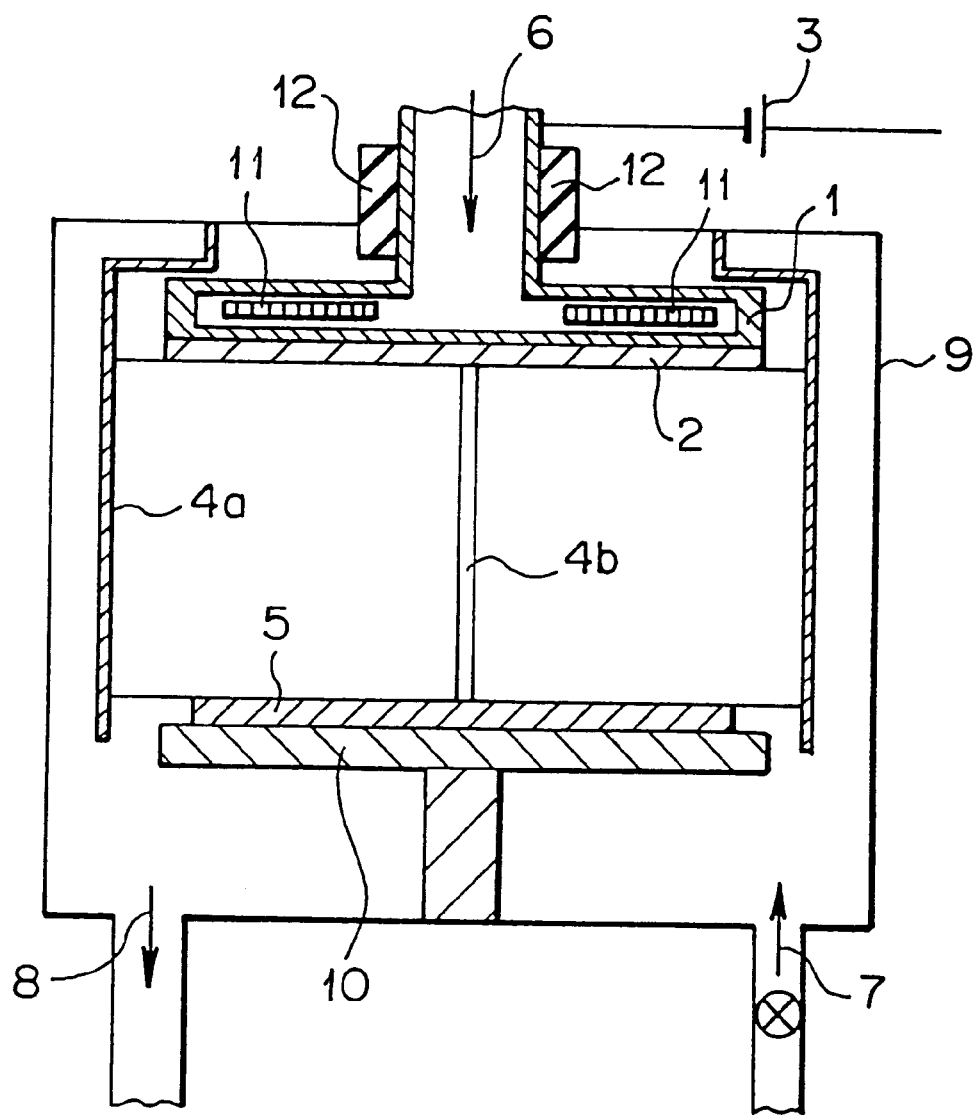
FIG. 2 is a sectional view showing a sputtering apparatus according an embodiment of the present invention.

An embodiment of the present invention will be explained concretely with reference to the accompanying drawings below. In this embodiment, the present invention is applied to sputtering under four kinds of film formation conditions. FIG. 2 is a sectional view showing a sputtering apparatus according an embodiment of the present invention. FIGS. 3A to 3D are perspective views showing constituent elements in a chamber of the sputtering apparatus. FIG. 4 is a plan view showing the structure of a target material shown in FIG. 3B.

As shown in FIG. 2, the sputtering apparatus includes a cylindrical chamber 9, which is provided at its bottom with an Ar gas introducing port 7 and an exhaust port 8 for introducing and exhausting air, respectively. A wafer holder 10 for holding a silicon wafer 5 is disposed on a bottom wall within the chamber 9. A target electrode 1 is supported by the chamber 9 at its upper portion through an insulator 12. A high-voltage power source 3 is connected to this target electrode 1. A cylindrical shield plate 4a is supported by an upper portion of the chamber 9 such as to surround the target electrode 1, a target material 2 and the silicon wafer 5. Another shield plate 4b is disposed between the target material 2 and the wafer 5. The shield plate 4b comprises four plates disposed radially relative to a position aligned to the center of the wafer 5.

Figure 3A:
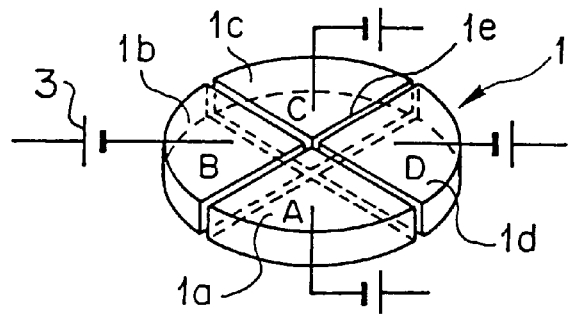
FIGS. 3A to 3D are perspective views showing constituent elements in a chamber of the sputtering apparatus.
Figure 3B:
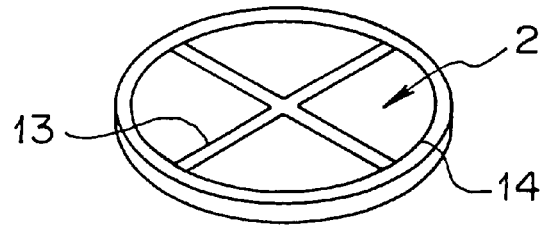
Figure 3C:
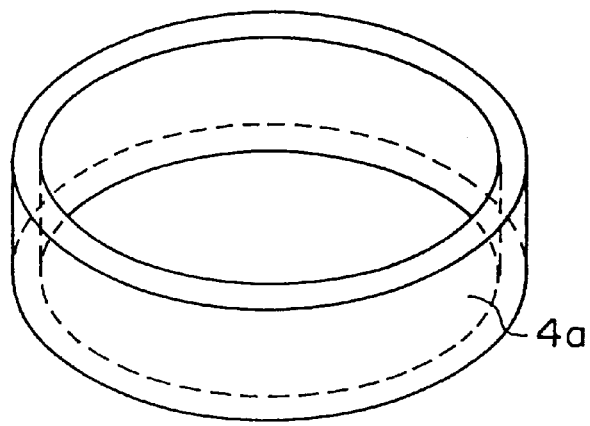
Figure 3D:
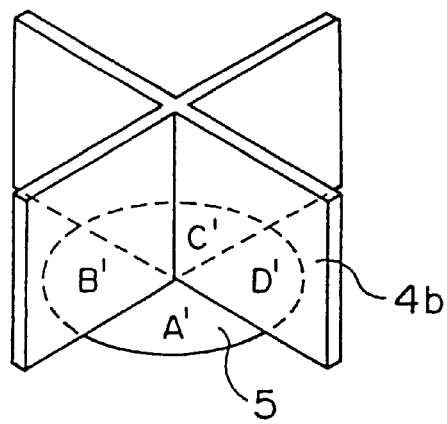
Figure 4:
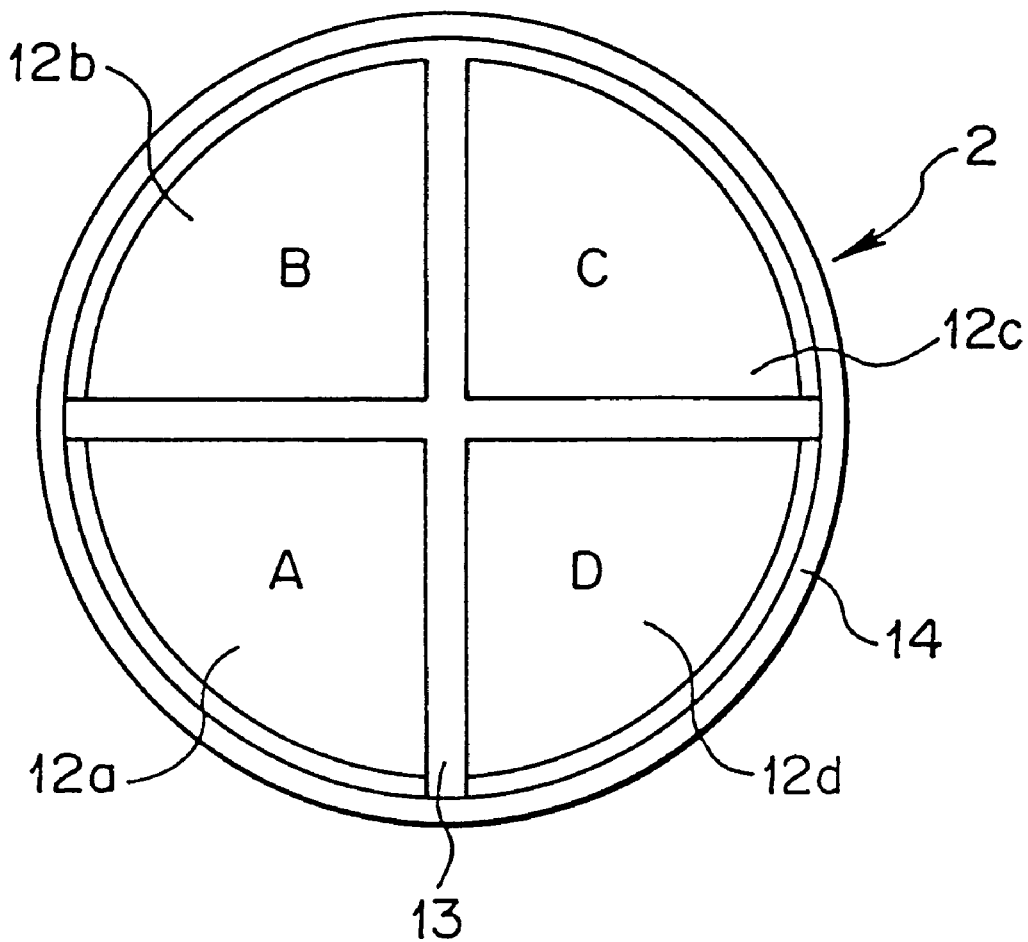
FIG. 4 is a plan view showing the structure of a target material shown in FIG. 3B.

As shown in FIG. 3A, the target electrode 1 comprises a disk equally divided into four fan-like electrodes by two line segments passing through its center perpendicularly. Such divided electrodes 1a, 1b, 1c and 1d are insulated and separated from one another by band-like insulators 1e. A magnet 11 is built in each of the divided electrodes 1a to 1d, as shown in FIG. 2, so that plasma is adjusted by magnetic field by the magnet 11. Each of the divided target electrodes 1a to 1d is formed hollow so that coolant 6 flows therethrough to cool the latter.

As shown in FIG. 4, the target material 2 is also equally divided into four pieces like the target electrode 1. That is, the target material 2 comprises four fan-like target materials 12a, 12b, 12c and 12d obtained by equally dividing a disk into four by two line segments passing through its center perpendicularly. A cross-shaped frame 13 is fitted in a ring-like frame 14 such that the crossing point of the frame 13 coincides with the center of the frame 14, and jointed together. Each of the frames 13 and 14 may be formed of an insulating material. The divided target materials 12a to 12d are fitted to the four fan-like portions surrounded by the ring-like frame 14 and the cross-shaped frame 13, respectively. Two straight sides of each of the divided target materials 12a to 12d are jointed to the cross-shaped frame 13, and the divided target materials 12a to 12d, the frames 13 and 14 are assembled. Since the divided target materials 12a to 12d are insulated from one another by the ring-like frame 14 and the cross-shaped frame 13, it is possible to individually control the voltage to each of the divided targets. The thickness of each of the frames 13 and 14 is preferably thinner than those of the divided target materials 12a to 12d. Therefore, when the divided target materials 12a to 12d are absorbed by the target electrode 1, the target electrode 1 directly contacts with the divided target electrodes 1a to 1d without being disturbed by the frames 13 and 14. Each of the divided target materials 12a to 12d of the target material 2 contains material of the film to be formed on the wafer 5.

The operation of the sputtering apparatus constituted as described above will be explained next. First, the target material 2 shown in FIG. 4 is fit into a lower surface of the target electrode 1 shown in FIG. 2. In this case, the target material 2 is disposed such that the target electrodes 1a to 1d and the divided target materials 12a to 12d are brought into alignment with each other, and that the insulator 1e and the insulating frame 13 are brought into alignment with each other. Further, the shield plate 4b is disposed on the wafer 5 in alignment with the insulating frame 13 of the target material 2.

Thereafter, the chamber 9 is exhausted and Ar gas is introduced into the chamber 9 to a predetermined pressure. Then, negative voltage is applied to each of the divided target electrodes 1a to 1d from the power source 3. As a result, plasma discharge is generated in four spaces partitioned by the shield plates 4a and 4b, $Ar^+$ ions collide against the divided target materials 12a to 12d to which the negative electric charge is applied, so that atoms are released from the divided target materials 12a to 12d. These atoms from the divided target materials 12a to 12d are accumulated on the wafer 5. Then, if the supply voltage to the divided target electrodes 1a to 1d is stopped, the sputtering is completed.

In the present embodiment, the film formation conditions such as voltage to be applied to each of the divided target electrodes 1a to 1d and the applying time may be individually controlled. Therefore, the film formation conditions such as the film formation speed and the film formation time may be controlled and the sputtering particles may be accumulated individually in the four regions partitioned by the shield plate 4b of the wafer 5. Atoms released from the divided target materials 12a to 12d are shielded by the shield plate 4b and thus, the atoms should not be accumulated on the wafer of the adjacent region. Further, since the target electrode 1 is also divided, if there is a region in which it is unnecessary to form a film or it is unnecessary to form a film exceeding a constant thickness, it is possible to easily control the film formation by cutting the electric conduction or suspending the electric conduction in progress to the divided electrode corresponding to such a region.

As described above, according to the present embodiment, it is possible to form the films of different thickness or under different conditions in each of the regions A to D.

Although the wafer 5 is divided into four pieces in the above-described embodiment, it is possible to set, e.g., two kinds of, three kinds of, or five or more kinds of sputtering conditions on one wafer by changing the number of divisions of the target electrode 1, the target material 2 and the shield plate 4b.

What is claimed is:

1. A sputtering apparatus, comprising:
   a chamber having gas ports for gas intake and exhaust;
   a wafer holder in said chamber;
   a target electrode in said chamber opposite said wafer holder, said target electrode comprising an electrically conductive circular disc that is divided into plural electrically separated first sectors that each have radial sides and an end that is a portion of an arc of a periphery of said circular disc, and a radially extending electrical insulator that electrically separates said first sectors from each other;
   a target in said chamber on said target electrode between said target electrode and said wafer holder, said target comprising a circular disc of sputtering target material that is divided into plural second sectors by a radially extending, electrically insulating frame, each of said second sectors corresponding to and being electrically connected to a respective one of said first sectors, said electrically insulating frame being aligned with said electrical insulator of said target electrode;
   a shield plate comprising radially extending plate members that are each aligned with a respective portion of said electrically insulating frame and that are arranged between said target and said wafer holder to divide said chamber into plural sputtering chambers that are each associated with a different one of said second sectors of said target; and
   a power source connected to each of said first sectors of said target electrode to separately control a voltage applied to each of said first sectors.

2. The apparatus of claim 1, wherein each of said first sectors of said target electrode is hollow and houses a magnet.

3. The apparatus of claim 1, wherein each of said first sectors includes about 90° of arc of said target electrode.

* * * * *